TUNABLE TUNNEL DIODE OSCILLATOR

Filed July 28, 1966

3 Sheets-Sheet 1

INVENTOR.
ROBERT G. VELTROP

BY John F. Lawler

ATTORNEY

Aug. 29, 1967 R. G. VELTROP 3,339,154

TUNABLE TUNNEL DIODE OSCILLATOR

Filed July 28, 1966 3 Sheets-Sheet 2

INVENTOR.
ROBERT G. VELTROP

BY John F. Lawler

ATTORNEY

TUNABLE TUNNEL DIODE OSCILLATOR

Filed July 28, 1966 3 Sheets-Sheet 3

INVENTOR.
ROBERT G. VELTROP

BY John F. Lawler

ATTORNEY 3,339,154

TUNABLE TUNNEL DIODE OSCILLATOR

Robert G. Veltrop, Sunnyvale, Calif., assignor to Sylvania Electric Products Inc., a corporation of Delaware
Filed July 28, 1966, Ser. No. 568,634
10 Claims. (Cl. 331—107)

This invention relates to oscillators and more particularly to an improved tunable tunnel diode oscillator.

An especially simplified tunnel diode oscillator that has been proposed in the past includes a tunnel diode connected in parallel with an inductance derived from an associated length of short-circuited transmission line. Principal disadvantages of this prior art type of oscillator are: (a) small variations in temperature, bias voltage or load impedance cause a relatively large shift in the frequency of oscillation because this circuit has a relatively low Q; and (b) mismatches occurring outside the operating frequency band of the oscillator tend to cause spurious oscillations. A tunable cavity-backed tunnel diode oscillator which overcomes these disadvantages is disclosed in an article entitled, "A Tunable Tunnel Diode Converter," by R. G. Veltrop, published in Solid State Design, April 1965, pages 23–31.

The cavity-backed tunnel diode oscillator comprises a series combination of a rejection cavity and a transmission line connected in parallel with a tunnel diode. The physical length of the transmission line and the position of the cavity remain fixed as the cavity and tunnel diode circuit are tuned. For clarity and consistency of terms and terminology, the word "oscillator" as used herein refers to the combination of the tunnel diode and cavity circuits, "tunnel diode circuit" means the diode and the associated inductance and diode capacitance, and "cavity" is the resonant structure connected to the tunnel diode circuit. The cavity is resonant at the center frequency of the operating frequency band of the oscillator and provides a short circuit which connects the transmission line in parallel with the tunnel diode. The electrical length of the transmission lines is less than a quarter wavelength at the center of the band to provide the proper inductance to resonate with the diode capacitance at the center frequency. The oscillator is tuned by varying the resonant frequency of the cavity in order to vary the total inductance (the inductance of the transmission line plus the inductance of the rejection cavity) in parallel with the tunnel diode. Since the effective Q of the cavity-backed oscillator is much larger than the Q of the prior art oscillator, the cavity compensates for changes in operating frequency which may be caused, for example, by changes in diode parameters. The cavity-backed oscillator is stabilized at frequencies outside the operating frequency band by the relatively constant load impedance which is provided by the rejection cavity at all frequencies not immediately proximate to the resonant frequency thereof and which has a magnitude less than the magnitude of the diode resistance. As the oscillator is tuned, the difference between the oscillator output frequency and the resonant frequency of the cavity increases until the oscillator drops out of oscillation because of excess loading of the diode. This condition occurs in this cavity-backed oscillator before the maximum available tuning bandwidth of which the cavity is capable is reached. That is to say, the frequency at which the tunnel diode ceases to oscillate is such that the bandwidth of this cavity-backed oscillator is less than the bandwidth of the prior art oscillator first mentioned above.

An object of this invention is the provision of broadband tunable tunnel diode oscillator having a simplified tuning mechanism.

Another object is the provision of a tunable cavity-backed tunnel diode oscillator which is stable and free from spurious oscillation over a wide band of frequencies.

A more specific object is the provision of a broadband cavity-backed tunnel diode oscillator in which the tunnel diode and the cavity are simultaneously tuned so that the resonant frequency of the cavity is the oscillator output frequency.

These and other objects of this invention are accomplished by electrically connecting a series combination of a tunable rejection cavity and a transmission line in parallel with a tunnel diode. At resonance, the cavity is effectively a short circuit which connects the line in parallel with the diode. The capacitance of the diode and the inductance of the line are resonant at a frequency substantially equal to the resonant frequency of the cavity. The oscillator is tuned by simultaneously varying (1) the inductance of the cavity to change its resonant frequency and (2) the point at which the cavity is coupled to the line. This changes the length and thus the inductance of the line and consequently the frequency of the tunnel diode circuit. The operating frequency of the tunnel diode circuit and the resonant frequency of the cavity are maintained substantially equal by simultaneously varying the respective inductances thereof at substantially the same rate.

This invention and these and other objects thereof will be more fully understood from the following description of a preferred embodiment thereof together with the following drawings in which.

Figure 1:
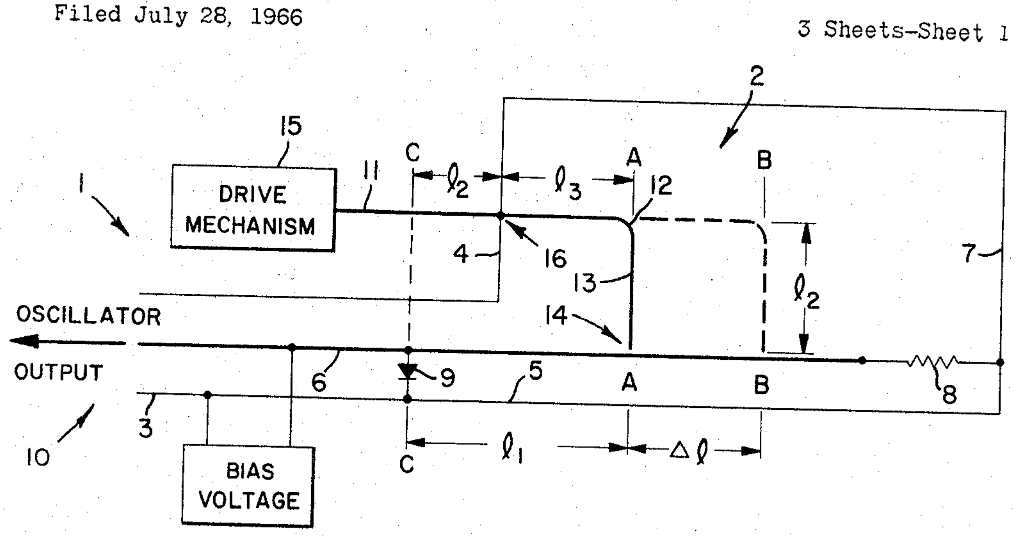
FIGURE 1 is a schematic diagram of an oscillator embodying this invention.

A preferred form of the invention is an oscillator shown in FIGURE 1 comprising a coaxial transmission line 1 coupled to an adjoining rejection cavity 2. One end of outer conductor 3 of the transmission line is connected to the walls 4 and 5 of the cavity. The center conductor 6 of the transmission line extends into cavity 2 and is electrically connected to cavity wall 7 through load resistor 8. A tunnel diode 9 is connected between center conductor 6 and outer conductor 3 of the transmission line. A bias source of voltage is connected in parallel with the tunnel diode so that the latter may be caused to exhibit a negative resistance typical of the oscillatory mode of the device. The oscillator output is coupled from end 10 of the transmission line opposite from the cavity.

A conductive rod 11 is spaced from and preferably is parallel to center conductor 6, and has one end 12 with a probe section 13 located in the cavity. The end of probe 13 is adjacent to and spaced from conductor 6 to provide a gap 14 therebetween. The end of conductor 11 remote from the probe section is connected to drive mechanism 15 which longitudinally moves conductor 11 relative to the cavity and parallel to conductor 6. Such movement of conductor 11 within the cavity changes in the position of probe 13 and the location of gap 14, and this in effect changes the length of conductor 6 between probe 13 and the tunnel diode. Conductor 11 is electrically connected or "short-circuited" to the cavity wall 4 at 16.

Figure 2:
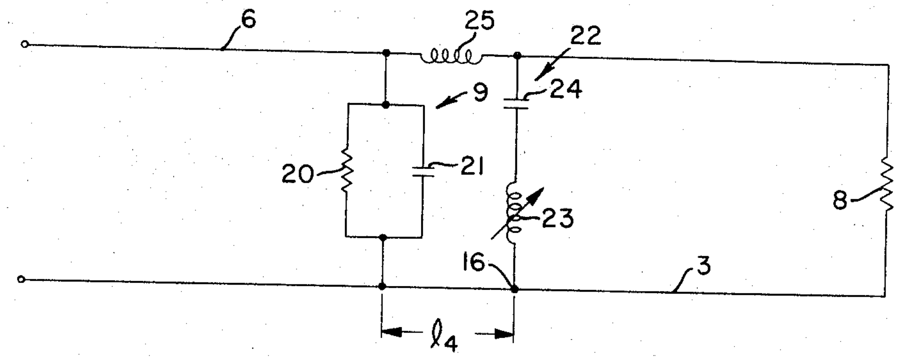
FIGURES 2 and 3 are schematic circuit diagrams of the oscillator of FIGURE 1 illustrating operation thereof at different frequencies.
Figure 3:
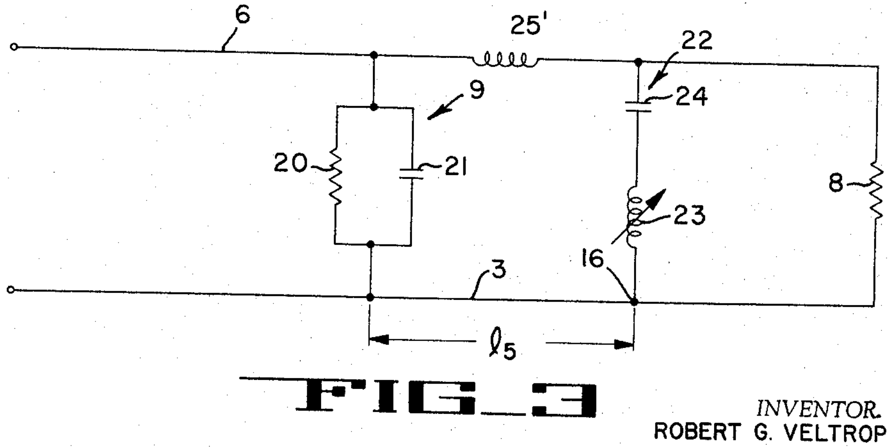

The equivalent circuit of the oscillator of FIGURE 1 is shown in FIGURES 2 and 3 wherein tunnel diode 9 is represented by the parallel combination of resistor 20 having a negative conductance and a capacitor 21. Rejection cavity 2 is shown as a series-tuned circuit 22 having a variable inductor 23 representing the inductance of the variable length of conductor 11 in the cavity and capacitor 24 representing the capacitance of gap 14 between conductors 6 and 11. Inductor 25 represents the inductance of the length of conductor 6 between the tunnel diode and gap 14. Resistor 8, which is connected in parallel with circuit 22, is the load resistor terminating the cavity.

The two conditions which must be met for a tunnel diode to oscillate are: (1) the magnitude of the circuit conductance connected across the tunnel diode must be less than the magnitude of the negative conductance of the tunnel diode, or alternatively the magnitude of the resistance of the tunnel diode must be less than the load resistance, and (2) an inductive susceptance having a value equal to the diode capacitive susceptance must be associated with the tunnel diode. The resistance of a tunnel diode is approximately −30 ohms. In this oscillator, the characteristic impedance of the coaxial transmission line to the left of the tunnel diode as viewed in FIGURE 1 and the load connected to the oscillator output are approximately 50 ohms. Thus, the magnitude of the negative resistance of the tunnel diode is less than the load impedance and condition (1) is satisfied. The second condition remains to be satisfied.

At the center of the operating band, the length of conductor 11 to the right of its cavity connection 16, see FIGURE 1, is adjusted such that the inductance thereof (equivalent inductor 23) and the capacitance of gap 14 (equivalent capacitor 24) comprising the rejection cavity are resonant at the center frequency. This condition is represented in FIGURE 1 wherein probe 13 is aligned with line A—A. At resonance, rejection cavity 2 is a short circuit (between outer conductor 3 and center conductor 6 at line A—A) which connects the length $l_1$ of conductor 6 in parallel with the tunnel diode. In accordance with this invention, the length $l_1$ of conductor 6 is adjusted at the center frequency so that the inductance thereof (inductor 25) is resonant with the diode capacitance (capacitor 21) at that frequency. Thus, the second condition for the tunnel diode to oscillate is met.

In accordance with this invention, the oscillator is tuned by varying the position of the short circuit at line A—A on conductor 6. By way of example, movement of conductor 11 to the right as viewed in FIGURE 1 to align probe 13 with line B—B causes an increase $\Delta l$ in the length of conductor 11 in cavity 2 and an increase in the inductance thereof (inductor 23). This increase in the inductance of the rejection cavity causes the resonant frequency thereof to decrease. Movement of probe 13 and the position of the short circuit on conductor 6 from line A—A to line B—B also causes the electrical length of conductor 6 between the diode and the short circuit, and thus the inductance thereof (equivalent inductance 25') also increases. This increase in the inductance of inductor 25 is equal to the change in the inductance of inductor 23, and the operating frequency of the oscillator and is therefore substantially equal to the resonant frequency of the cavity. The resonant frequency of the cavity and the oscillator frequency are maintained substantially equal as the oscillator is tuned across the band by varying the respective inductances thereof (inductors 23 and 25', respectively) at substantially the same rate.

Rejection cavity 2 is a high Q circuit having a sharp resonance characteristic. The rejection cavity is terminated by a 25 ohm matched load (resistor 8) which stabilizes the oscillator. At resonance, load 8 is short-circuited by cavity 2 and the circuit oscillates. Off resonance, however, the circuit is loaded by resistor 8 which has a resistance that is less than the magnitude of the negative resistance of the tunnel diode so that the circuit is stable and will not oscillate. Maintaining the oscillator frequency substantially equal to the resonant frequency of the cavity prevents the conductance from loading the circuit and quenching oscillations. This operation enables the oscillator to be turned over a broad band of frequencies.

If the resonant frequency of the rejection cavity is maintained equal to the oscillator frequency there is theoretically no limit to the band of frequencies over which the oscillator will oscillate. This condition may be approached in practice by the oscillator of FIGURE 1. Assuming that a tunnel diode having a fixed diode capacitance (capacitor 21) is available, gap 14 is adjusted to provide a constant capacitance (capacitor 24) which is equal to the diode capacitance (capacitor 21). In order to make the cavity resonant at the oscillator frequency, it is only necessary to make the respective inductances (inductors 23 and 25) of these circuits equal. This is accomplished in the circuit of FIGURE 1 by offsetting the short circuit connection 16 of conductor 11 from the center line C—C of the diode by a distance $l_2$ which is equal to the length of probe 13. Thus, the length $l_1$ of conductor 6 is equal to the length $l_2+l_3$ of conductor 11 in the cavity and the inductances thereof are equal. Movement of conductor 11 to vary the length $l_2+l_3$ thereof in the cavity causes an identical change in the length $l_1$ of conductor 6. Thus, the resonant circuits comprising the injection cavity and the oscillator are maintained identical and the oscillator will oscillate ideally over an unlimited band of frequencies.

The loaded Q of a rejection cavity is directly proportional to the capacitive reactance thereof and is therefore inversely proportional to frequency. Thus, although the "ideal" circuit referenced above has an unlimited bandwidth, its $Q_L$ varies with frequency. This means that although the oscillator will oscillate over a very broad band of frequencies, the percent frequency deviation, which is inversely proportional to $Q_L$, will increase with frequency.

In practice, it is desirable to have an oscillator that oscillates over a finite broad band of frequencies and has a value, frequency deviation, and power output that are relatively constant. Such an oscillator is obtained by maintaining at a constant value the capacitive reactance or susceptance of gap 14 rather than the gap capacitance. This result is obtained by causing the gap capacitance to be a hyperbolic function of frequency. This may be accomplished by forming conductor 6 with a diameter that decreases from a maximum at load 8 to a minimum at the tunnel diode, or, alternatively, moving conductor 11 (and probe 13) into the cavity in a direction converging toward conductor 6.

Figure 4:
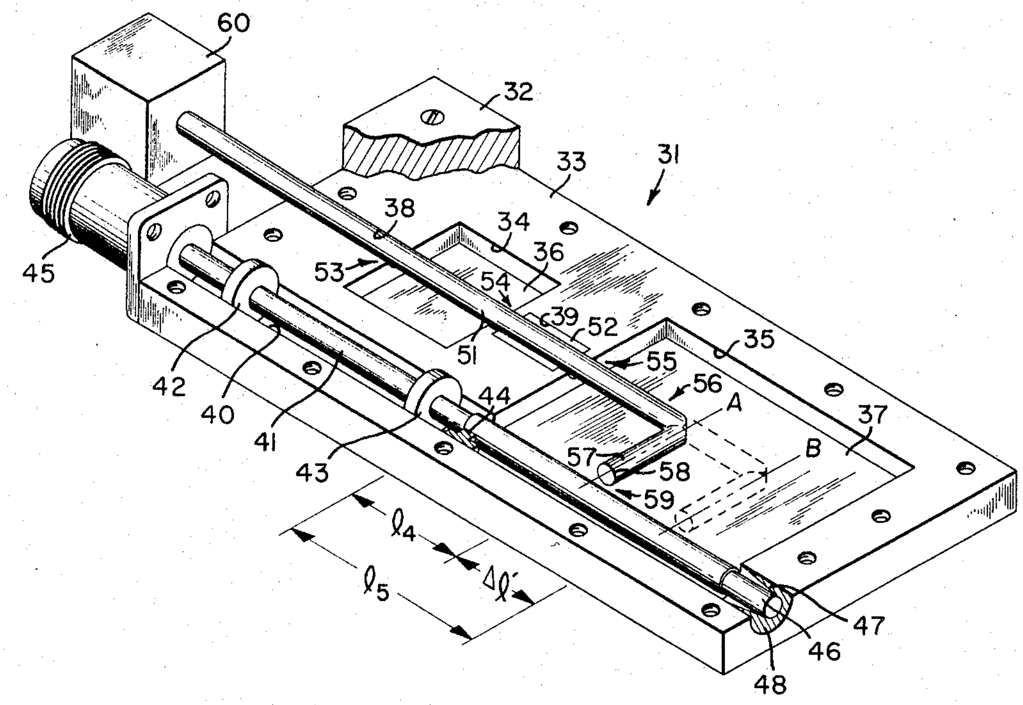
FIGURE 4 is a perspective view of an oscillator of the type shown in FIGURE 1 with one plate broken away to show the internal construction.

An actual embodiment of this invention is shown in FIGURE 4. The assembly comprises a split-block housing 31 having substantially identical plates 32 and 33. Each plate has a pair of openings 34 and 35 therein which form cavities 36 and 37, respectively, in the housing. Plates 32 and 33 each have axially aligned semicylindrical grooves 38 and 39 therein which are parallel to a third semicylindrical groove 40.

The semicylindrical surface defining groove 40 corresponds to the outer conductor of coaxial transmission line 1 (see FIGURE 1). An electrically conductive rod 41 which is disposed in groove 40 and extends through cavity 37 comprises the center conductor of the coaxial transmission line. Rod 41 is centered in the groove 40 by dielectric washers 42 and 43. A tunnel diode 44 is electrically connected between center conductor 41 and the housing. One end of conductor 41 is connected to a coaxial connector 45 which is secured to the housing by screws. The other end of conductor 41 is connected to a load 46. The diameter of conductor 41 in cavity 37 is tapered to vary linearly from a predetermined diameter adjacent load 46 to a smaller diameter adjacent the tunnel diode.

Load 46 is located in an opening 47 in the plates. The impedance of the load is equal to the characteristic impedance of the coaxial transmission line. The load is electrically connected through impedance matching element 48 to the plates.

A second electrically conductive rod 51 is centered in grooves 38 and 39 and extends into cavity 37. The diameters of rod 51 and groove 38 are such that rod 51 makes a smooth sliding fit in the split-block housing. A dielectric sleeve 52 is located in groove 39 to insulate rod 51 from the plates in this area. Although rod 51 is a smooth sliding fit in the split-block housing, the electrical connection between rod 51 and the housing at point 53 may actually be a small resistance in the order of one ohm. The electrical length of conductor 51 in cavity 36 is adjusted to be a quarter wavelength at the center of the operating frequency band of the oscillator so that cavity 36 and conductor 51 therein comprises an impedance transformer or high impedance choke joint having an impedance in the order of 200 ohms. Cavity 36 and conductor 51 therein transforms the relatively low impedance at point 53 to a very large impedance at point 54.

The electrical length of conductor 51 in sleeve 52 is also adjusted to be a quarter wavelength between points 54 and 55 at the center of the band. Thus, sleeve 52 and conductor 51 therein comprise an impedance transformer or low impedance choke joint having an impedance in the order of 5 ohms which transforms the very high impedance at point 54 to a very low impedance at point 55 to provide an effective short circuit between conductor 51 and the housing at point 55. The end 56 of conductor 51 in cavity 37 has a probe section 57 having a circular end portion 58 which is adjacent to and spaced from conductor 41 to form a gap 59 therebetween. The inductance of conductor 51 in cavity 37 between point 55 and end 58, and the capacitance of gap 59 comprise the rejection cavity 22, see FIGURES 2 and 3. The other end of conductor 51 is connected to a drive mechanism such as a motor 60 for providing movement of conductor 51 into and out of the housing. The bias source for biasing the tunnel diode to exhibit a negative conductance is not shown in FIGURE 4.

The operation of the oscillator of FIGURE 4 is similar to the operation of the oscillator of FIGURE 1 except that both the capacitance of gap 59 (capacitor 24 in FIGURES 2 and 3) and the inductance of conductor 51 in cavity 37 (inductor 23 in FIGURES 2 and 3) vary as conductor 51 is moved within cavity 37. Although this variation in the gap capacitance causes the $Q_L$ characteristic of the cavity to be substantially constant, it introduces a small frequency difference between the resonant frequency of the cavity and the oscillation frequency as the oscillator is tuned. This small frequency difference does not seriously affect operation of the oscillator, however, which may have greater than octave bandwidth.

An actual oscillator embodying the circuit shown in FIGURE 4 had a bandwidth greater than an octave (center frequency of 3 gHz.), a frequency deviation which was constant within 2 mHz., a $Q_L$ which was substantially constant at 75, and a power output that varied only 1.0 db over the octave bandwidth. The maximum bandwidth obtainable at the same power output from the cavity-backed oscillator disclosed in the prior art publication referenced above was approximately one-half an octave.

Figures 5, 6:
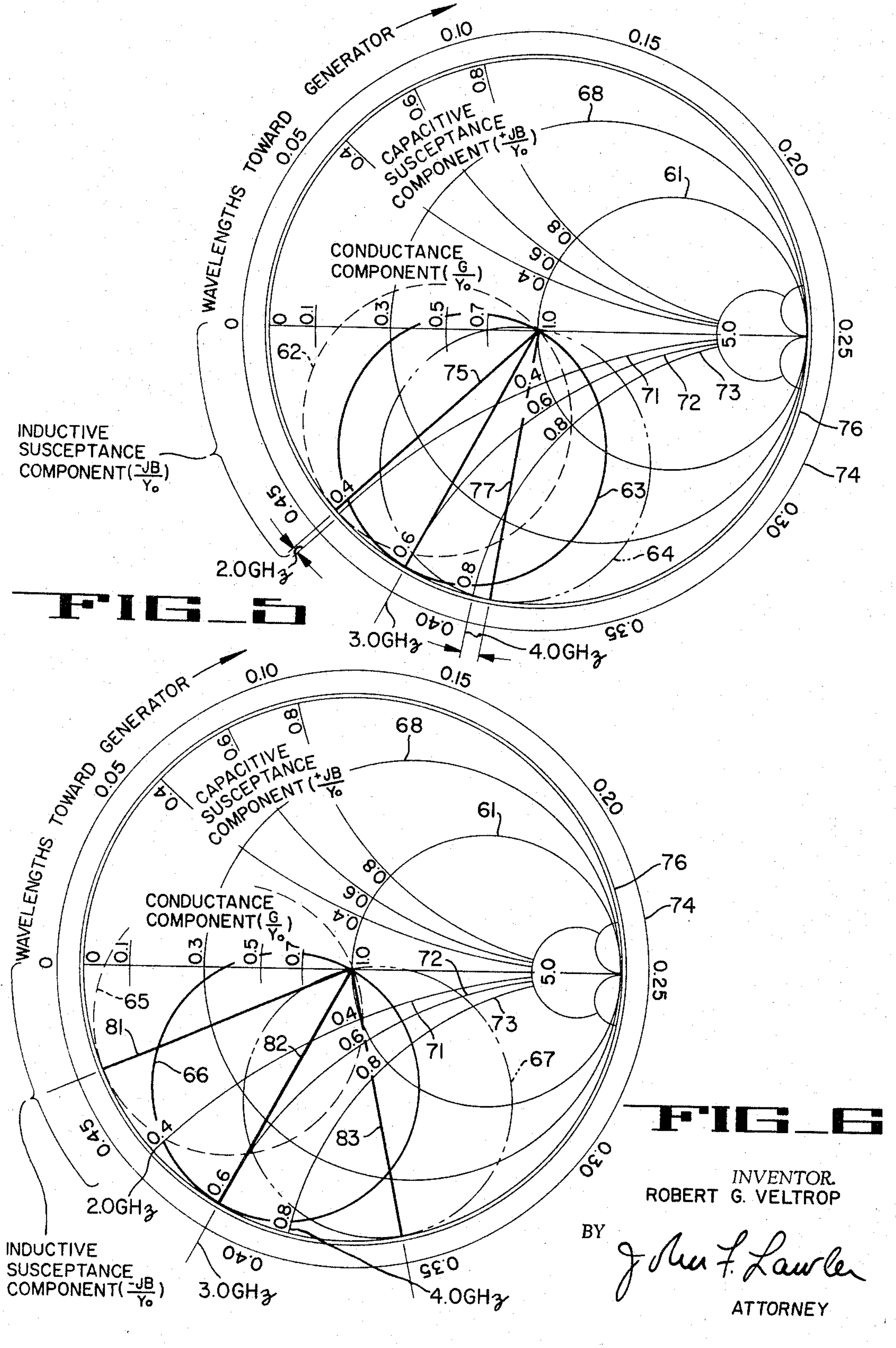
FIGURE 5 is a Smith chart illustrating operation of this invention.
FIGURE 6 is a Smith chart illustrating operation of the cavity-backed oscillator described in the prior art publication referenced above.

The increased bandwidth provided by an oscillator constructed in accordance with this invention is illustrated graphically in the Smith chart diagrams in FIGURES 5 and 6. These charts represent the operation of oscillators designed in accordance with this invention and this prior art publication. Circle 61 is a plot of the admittance characteristic of the rejection cavity when measured at the cavity at gap 14. Circles 62, 63, and 64 (see FIGURE 5), are plots of the admittance characteristic of the rejection cavity 2 plus the length $l_1$ of conductor 6 when measured at the tunnel diode at 2.0 gHz., 3.0 gHz. and 4.0 gHz., respectively. Circles 65, 66 and 67 (see FIGURE 6) are similar plots illustrating operation of the cavity-backed oscillator of the prior publication. Circle 68 is a plot of the magnitude (all values are normalized) of the conductance of the tunnel diode. If the circuit is loaded by an impedance having a conductance greater than the diode conductance (i.e., if the load conductance is inside circle 68 of constant conductance), the oscillator will not oscillate. If the load conductance is less than the diode conductance (i.e., if the load conductance is outside the circle 68 of constant conductance), the oscillator can oscillate.

Consider that the oscillator employs a tunnel diode having a normalized capacitive susceptance $B_c$=0.4 at 2 gHz., $B_c$=0.6 at 43 gHz., and $B_c$=0.8 at 4 gHz. The curves 71, 72, and 73 represent the negative of the diode capacitive susceptances at 2, 3, and 4 gHz., respectively. At the center frequency 3 gHz., the rejection cavity and the tuned circuit comprising the oscillator are both resonant. In order for the oscillator to oscillate at the center frequency, probe 13, see FIGURE 1, is positioned so that the length $l_1$ of conductor 6 (between the tunnel diode and gap 14) is such that the inductive susceptance thereof (inductor 25) is equal to the capacitive susceptance of the diode. Reference to circle 74 of FIGURE 5 reveals that the length $l_1$ of conductor 6 must be 0.164λ in order that the line shall have an inductive susceptance of −0.6, curve 72 in FIGURE 5. Since the rejection cavity is also resonant at the center frequency 3.0 gHz., if the point of tangency of circle 61 is rotated from 0.25λ to 0.414λ (through 0.164λ), it coincides with circle 63 which is a plot of the admittance characteristics of the rejection cavity and the length $l_1$ of conductor 6 measured at the diode. Thus, the circle 74 between 0.25 and 0.414 represents the length $l_1$ of conductor 6.

The oscillator is tuned to operate at 2.0 gHz., for example, by moving conductor 11 into the cavity to increase the length of conductor 6 between the tunnel diode and the cavity (the gap 14) such that it has an inductive susceptance of −0.4. This corresponds to the curve 71. The intersection of curve 71 and circle 62 designates the operating frequency 2.0 gHz. of the oscillator. As stated previously, in order to maintain the $Q_L$ of the circuit more nearly constant, the resonant frequencies of the cavity and the tuned circuit comprising the oscillator are not maintained exactly equal over the band. Circle 62 is a plot of the admittance characteristic of the rejection cavity and the associated length of conductor 6. The intersection of line 75, through the point of tangency of circles 62 and 76, and circle 74 shows that there is a very small frequency difference $\Delta f$ between the oscillator frequency (curve 71) and the resonant frequency (line 75) of the cavity. This small frequency difference has little effect on the operation of the oscillator. The conductances of the circuit will not quench oscillation of the oscillator until the intersection of a circle 62 and the associated curve 71 coincides with circle 68. Reference to FIGURE 5 reveals that the intersection of curve 71 and circle 62 is not even close to the lower frequency of oscillation of the oscillator and has little effect on the operation thereof.

The intersections of curve 73 and line 77 with circle 74 designate the operating frequency (4 gHz.) of the oscillator and the corresponding resonant frequency of the rejection cavity, respectively. Reference to FIGURE 5 reveals that the oscillator frequency can be increased considerably above the frequency 4 gHz. before oscillation of the oscillator is quenched when the intersection of curve 73 and circle 64 (the left side, as viewed) coincides with circle 68.

The plots of FIGURES 5 and 6 are similar, except that FIGURE 6 illustrates the operation of a cavity-backed oscillator constructed in accordance with the referenced publication. The intersections of curves 71, 72, and 73 with circle 74 designate the operation frequencies 2, 3, and 4 gHz., respectively, of the oscillator. The intersections of the lines 81, 82, and 83 (through the points of tangency of circles 65, 66, and 67) and circle 76 designate the resonant frequencies of the rejection cavity corresponding to operation of the oscillator at the frequencies 2, 3, and 4 gHz., respectively. The intersection of line 72 and circle 66 shows that at the center of the band (3 gHz.), the oscillator and the cavity operate at the same frequency. The intersection of curve 71 and circle 67 coincides with circle 68 indicating that oscillation of the oscillator will be quenched at or near the frequency 2 gHz., showing that the lower frequency limit of the oscillator must be greater than the frequency 2 gHz.

It will be noted that curve 73 and the associated circle 65 do not even intersect. This shows that the upper frequency limit of the cavity-backed oscillator is less than the frequency 4.0 gHz. Careful analysis of FIGURE 6 reveals that the cavity-backed oscillator will only operate over a frequency band of approximately 2.3 to 3.6 gHz. This graphic illustration of this operation of an oscillator incorporating this invention and a prior art cavity-backed oscillator shows that the oscillator incorporating this invention will operate over a much broader band of frequencies than the prior art cavity-backed oscillator.

Although this invention is described in relation to a specific embodiment thereof, the scope of the invention is defined in the following claims rather than the above detailed description.

What is claimed is:

1. An oscillator comprising a negative resistance device having a capacitance, means for biasing said device to exhibit a negative resistance, means having an inductance, a first tuned circuit electrically connecting said inductance means in parallel with said device, the inductance of said inductance means being related to the resonant frequency of said first tuned circuit, said inductance means and said diode capacitance comprising a second tuned circuit, and means for simultaneously varying the resonant frequency of said first tuned circuit and the inductance of said inductance means whereby to maintain the resonant frequencies of said first and second tuned circuits substantially equal.

2. The oscillator according to claim 1 wherein said negative resistance device is a tunnel diode.

3. The oscillator according to claim 2 wherein said first tuned circuit is a rejection cavity comprising a conductive enclosure forming a cavity, and a first conductor movable in and having one end electrically connected to said enclosure, and wherein said inductor means comprises a second conductor connected to said tunnel diode and extending into said enclosure, the other end of said first conductor in said enclosure being adjacent to and spaced from said second conductor whereby to form a gap therebetween defining a capacitance, said first conductor and said gap at resonance thereof short-circuiting said second conductor to said enclosure to connect said second conductor in parallel with said diode, movement of said first conductor simultaneously changing the inductances of said first conductor in the cavity and said second conductor between said diode and the gap at substantially the same rate for maintaining the resonant frequencies of said first and second tuned circuits substantially equal.

4. The oscillator according to claim 3 wherein the direction of movement of said first conductor is so related to the direction which the external surface of the second conductor adjacent to the first conductor extends that the capacitance at the gap changes with such movement and the corresponding gap capacitive susceptance is constant whereby the oscillator has a substantially constant Q factor.

5. The oscillator according to claim 4 in which the external dimension of said second conductor is tapered from a maximum to a minimum in the direction of movement of the first conductor.

6. A tunnel diode oscillator capable of being tuned across a broad band of frequencies, said oscillator comprising an electrically conductive housing having first, second, and third cylindrical bores providing cylindrical bearing surfaces and having first and second cavities therein, said first and second bores being axially aligned and parallel to said third bore, said first bore opening into said first cavity, said second bore opening into said first and second cavities, and said third bore opening into said second cavity, a cylindrical dielectric sleeve located in said second bore, a first conductor disposed in said third bore and extendind into said second cavity, means for centering and supporting said first conductor in said third bore and insulating said first conductor from said housing, a tunnel diode electrically connected between said first conductor and said housing, load means electrically connecting the end of said first conductor in said second cavity to said housing, means connected to said housing and the other end of said first conductor for coupling therefrom an output signal, a second conductor disposed in said first bore and in said dielectric sleeve, said second conductor extending through said first cavity and projecting into said second cavity, a portion of said second conductor in said second cavity being adjacent said first conductor and providing capacitive coupling thereto, said second conductor being directly electrically connected to said housing at the first junction of said first bore and said first cavity, said second conductor in said first cavity being a quarter wavelength at a frequency in the band for transforming the low impedance at the first junction to a high impedance at the second junction of said second bore and said second cavity, said second conductor in said second bore also being a quarter wavelength at a frequency in the band for transforming the high impedance at the second junction to a short circuit between said second conductor and said housing at the junction of said second bore and said second cavity, said second cavity, the inductance of said second conductor therein and the capacitance between said first and second ductors comprising a rejection cavity having a high loaded-Q factor and off resonance having a conductance with a magnitude greater than the magnitude of the conductance of said tunnel diode whereby to load said diode for preventing spurious oscillation thereof, said rejection cavity at resonance short-circuiting said first conductor to said housing for connecting said first conductor between said diode and said short circuit in parallel with said diode, said diode capacitance and the inductance of said first conductor between said diode and said short circuit comprising a tuned circuit, said rejection cavity and said turned circuit being resonant simultaneously at a frequency in the band, and means for moving said second conductor in said second cavity for tuning said rejection cavity and said tuned circuit while maintaining the resonant frequencies thereof substantially equal.

7. The oscillator according to claim 6 wherein the capacitance of said gap is adjustable and is equal the capacitance of said diode.

8. The oscillator according to claim 6 wherein the external dimension of said first conductor is tapered from a maximum at said load means to a minimum at said diode whereby the capacitance at the gap varies and the capacitive susceptance at the gap is constant resulting in a broadband oscillator having a constant $Q_L$.

9. The oscillator according to claim 8 wherein the length of said first conductor between said diode and the short circuit in said second cavity is substantially equal to the length of said second conductor in said second cavity, movement of said second conductor causing substantially identical variations in the equivalent inductances of said lengths of said first and second conductors for tuning said rejection cavity and said tuned oscillator circuit at substantially the same rate and maintaining the resonant frequencies thereof substantially equal.

10. The oscillator according to claim 9 wherein said second conductor in said second cavity has a probe with one end adjacent said first conductor and forming a gap therebetween defining a capacitance, movement of said second conductor causing a simultaneous change in the inductance of said second conductor in said second cavity and the position of the short circuit across the gap, and thus the inductance of said first conductor between said diode and the short circuit for causing said rejection cavity and said tuned circuit to resonate at substantially the same frequency.

References Cited

Veltrop: Solid State Design, "A Tunable Tunnel Diode Converter," p. 23–31, April 1965.

ROY LAKE, *Primary Examiner.*

JOHN KOMINSKI, *Examiner.*